United States Patent
Wu et al.

(10) Patent No.: US 11,538,898 B2
(45) Date of Patent: Dec. 27, 2022

(54) DISPLAY PANEL AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventors: Yan Wu, Beijing (CN); Liang Tang, Beijing (CN); Guoping Zhang, Beijing (CN); Jing Liu, Beijing (CN); Liman Peng, Beijing (CN); Qianqian Zhang, Beijing (CN); Liangliang Liu, Beijing (CN); Qiang Guo, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 113 days.

(21) Appl. No.: 17/191,737

(22) Filed: Mar. 4, 2021

(65) Prior Publication Data

US 2022/0052149 A1   Feb. 17, 2022

(30) Foreign Application Priority Data

Aug. 14, 2020 (CN) .......................... 202010819158.7

(51) Int. Cl.
*H01L 27/32* (2006.01)
*H01L 51/52* (2006.01)
*H05K 1/18* (2006.01)

(52) U.S. Cl.
CPC ........ *H01L 27/3279* (2013.01); *H01L 51/524* (2013.01); *H05K 1/189* (2013.01); *H05K 2201/10128* (2013.01)

(58) Field of Classification Search
CPC ............. H01L 27/3279; H01L 27/3276; H01L 51/524; H01L 51/529; H05K 1/189; H05K 2201/10128
See application file for complete search history.

(56) References Cited

U.S. PATENT DOCUMENTS

2022/0115483 A1*  4/2022  Li ...................... H01L 27/3276

\* cited by examiner

*Primary Examiner* — Anne M Hines
*Assistant Examiner* — Jose M Diaz
(74) *Attorney, Agent, or Firm* — Ling Wu; Stephen Yang; Ling and Yang Intellectual Property

(57) ABSTRACT

A display panel and a display apparatus are provided. The display panel includes an array substrate and an encapsulation cover plate, wherein a first power supply line and a second power supply line are arranged on a same layer on the array substrate, the second power supply line is disconnected by an opening, a first connecting line is connected with the first power supply line through the opening, a second connecting line is connected with the second power supply line, and the second power supply lines on both sides of the opening are electrically connected by a jumper arranged on the encapsulation cover plate.

20 Claims, 4 Drawing Sheets

DISPLAY PANEL AND DISPLAY APPARATUS

CROSS-REFERENCE TO RELATED APPLICATION

The present application claims the priority of Chinese Patent Application No. 202010819158.7 filed to the CNIPA on Aug. 14, 2020, the content of which is hereby incorporated by reference.

TECHNICAL FIELD

The present disclosure relates to, but is not limited to, the field of display technology, in particular to a display panel and a display apparatus.

BACKGROUND

With the development of technologies and due to the requirements of consumers for display images, the size of AMOLED (Active Matrix/Organic Light Emitting Diode) products is getting larger and larger, and accordingly, the number of light emitting pixels on the display panel is increasing, and a current required by all the light emitting pixels on the entire panel is also increasing.

A VDD (Voltage Drain)&VSS (Voltage Source) power supply wiring is provided on the display panel for supplying current to an EL (Electroluminescence) light emitting device, and test electrodes are respectively connected with the VDD&VSS power supply wiring. During the test, it is needed to apply high voltage to the VDD-VSS wiring, which makes the PLN (Planarization layer) film easy to be burned and carbonize. As the burn aggravates, conduction between the VDD&VSS power wirings is formed, thus an abnormality occurs to the display panel.

SUMMARY

The following is a summary of the subject matter described in detail in the present disclosure. This summary is not intended to limit the protection scope of the claims.

The present disclosure provides a display panel, which includes an array substrate and a encapsulation cover plate, wherein a first power supply line and a second power supply line are arranged on a same layer on the array substrate, the second power supply line is disconnected by an opening, a first connecting line is connected with the first power supply line through the opening, a second connecting line is connected with the second power supply line, and the second power supply lines on both sides of the opening are electrically connected by a jumper arranged on the encapsulation cover plate.

In an exemplary embodiment, the array substrate further includes a first test electrode and a second test electrode, the first test electrode is connected with the first connecting line, and the second test electrode is connected with the second connecting line.

In an exemplary embodiment, the second power supply line includes a main body portion and a first end portion located at both sides of the opening, and the first power supply line includes a second end portion, wherein the first connecting line is connected with the second end portion and the second connecting line is connected with the first end portion.

In an exemplary embodiment, the array substrate further includes a first test electrode and a second test electrode, the first test electrode is connected with the first connecting line, and the second test electrode is connected with the second connecting line.

In an exemplary embodiment, the first power supply line is a VDD line and the second power supply line is a VSS line.

In an exemplary embodiment, the VSS line is arranged on one side of the VDD line away from a longitudinal center line of the array substrate and close to a peripheral area of the display panel.

In an exemplary embodiment, a resistivity of the jumper is lower than a resistivity of a material of a gate layer on the array substrate.

In an exemplary embodiment, the jumper includes a jumper main body, and a first jumper contact and a second jumper contact which are electrically connected with both ends of the jumper main body.

In an exemplary embodiment, the array substrate includes a Planarization layer covering the layer where the first power supply line and the second power supply line are located, and the Planarization layer is provided with a first sub-opening and a second sub-opening, the first sub-opening and the second sub-opening expose the second power supply line and are configured as access points for the entrance of the first jumper contact and the second jumper contact and electrically connecting with the second power supply line.

In an exemplary embodiment, a part of the first end portion and a part of the second end portion which are not shielded by the encapsulation cover plate are configured to be connected with an electrode of a FPC.

In an exemplary embodiment, the Planarization layer is further provided with a third opening configured to allow the end portions of the first power supply line and the second power supply line electrically connecting with the FPC.

In an exemplary embodiment, the encapsulation cover plate includes a second glass substrate, and a fifth insulating layer, the jumper main body, a sixth insulating layer, the first jumper contact and the second jumper contact which are sequentially arranged on the second glass substrate, wherein the first jumper contact and the second jumper contact are electrically connected with the jumper main body through a conductive path.

The present disclosure further provides a display apparatus, which includes a display panel including an array substrate and an encapsulation cover plate, wherein a first power supply line and a second power supply line are arranged on a same layer on the array substrate, the second power supply line is disconnected by an opening, a first connecting line is connected with the first power supply line through the opening, a second connecting line is connected with the second power supply line, and the second power supply lines on both sides of the opening are electrically connected by a jumper arranged on the encapsulation cover plate.

In an exemplary embodiment, the second power supply line includes a main body portion and a first end portion located at both sides of the opening, and the first power supply line includes a second end portion, wherein the first connecting line is connected with the second end portion and the second connecting line is connected with the first end portion.

In an exemplary embodiment, a part of the first end portion and a part of the second end portion which are not shielded by the encapsulation cover plate are configured to be connected with an electrode of a flexible printed circuit board (FPC).

In an exemplary embodiment, the array substrate further includes a first test electrode and a second test electrode, the first test electrode is connected with the first connecting line, and the second test electrode is connected with the second connecting line.

In an exemplary embodiment, the first power supply line is a VDD line and the second power supply line is a VSS line.

In an exemplary embodiment, the VSS line is arranged on one side of the VDD line near a peripheral area of the display panel.

In an exemplary embodiment, a resistivity of the jumper is lower than a resistivity of a gate layer on the array substrate.

In an exemplary embodiment, the jumper includes a jumper main body, and a first jumper contact and a second jumper contact which are electrically connected with both ends of the jumper main body.

In an exemplary embodiment, the array substrate includes a Planarization layer covering the layer where the first power supply line and the second power supply line are located, and the Planarization layer is provided with a first sub-opening and a second sub-opening, the first sub-opening and the second sub-opening expose the second power supply line and are configured as access points for electrically connecting the first jumper contact and the second jumper contact with the second power supply line.

Other aspects will become apparent upon reading and understanding accompanying drawings and the detailed description.

BRIEF DESCRIPTION OF DRAWINGS

Other features, objects and advantages of the present disclosure will become more apparent by reading the detailed description of non-limiting embodiments made with reference to the following drawings.

DETAILED DESCRIPTION

Figure 1:
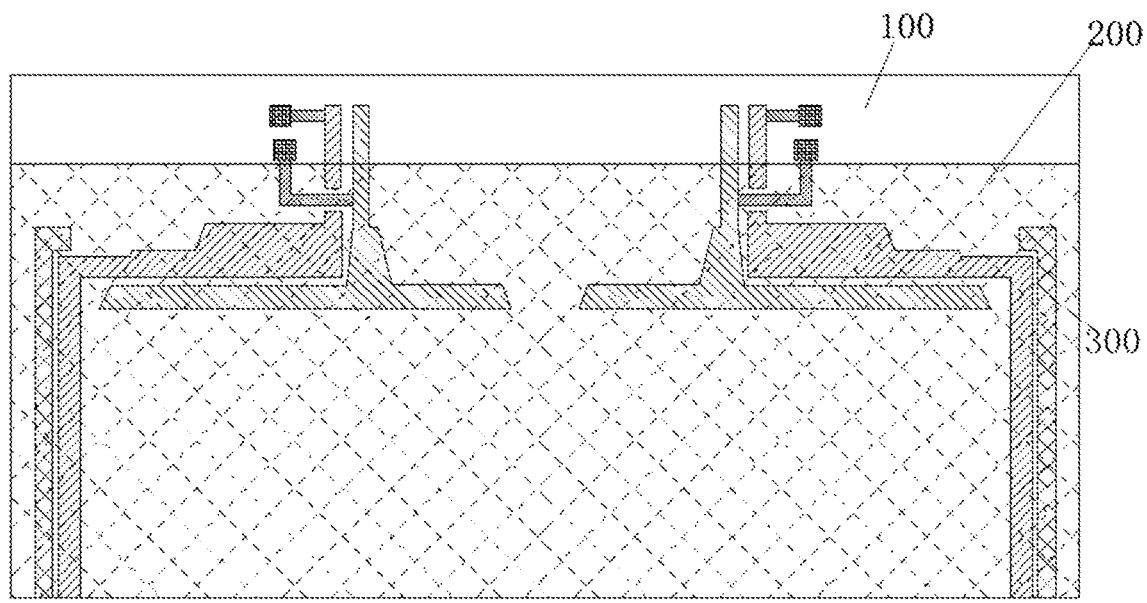
FIG. 1 is a partial schematic diagram of a display panel according to the present disclosure.

The following is a further detailed description of the present disclosure with reference to the drawings and embodiments. It can be understood that the specific embodiments described here are only used to explain the relevant disclosure, but not to limit the disclosure. In addition, for convenience of description, only the parts related to disclosure are shown in the drawings. It should be noted that embodiments in the present disclosure and features in the embodiments may be combined with each other arbitrarily if there is no conflict.

The words "first", "second" and the like used in the present disclosure do not indicate any order, quantity or importance, but are only used to distinguish different parts. Similar words such as "include" or "contain" mean that elements before the word cover the elements listed after the word, and the possibility of covering other elements is not excluded. "Up", "down", "left", "right", "inner", "outer", "top", "bottom" and the like are merely used to indicate a relative positional relation. Upon the change of an absolute position of a described object, the relative positional relation may also change accordingly.

Figure 2:
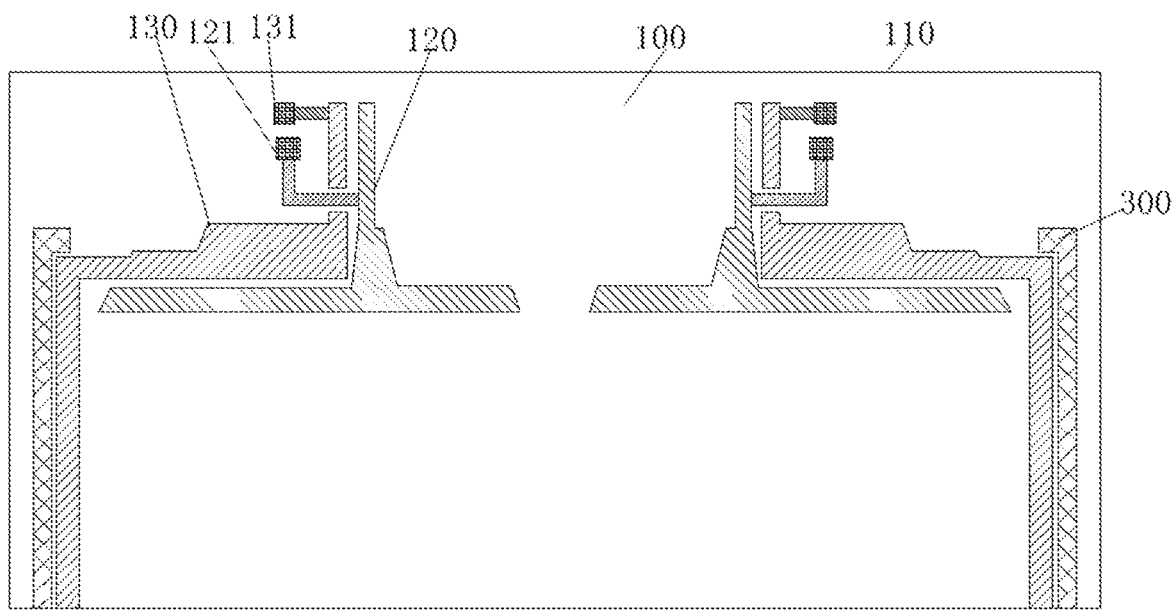
FIG. 2 is a front view of an array substrate of a display panel according to the present disclosure (after a Planarization layer is removed)
Figure 3:
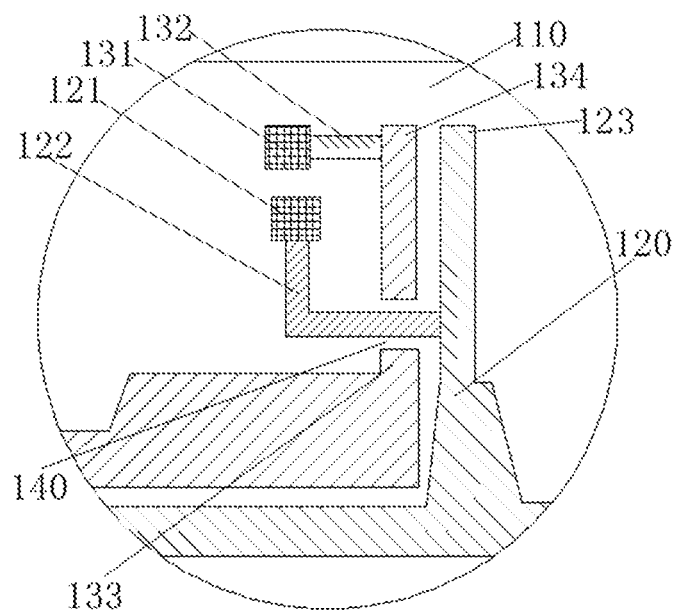
FIG. 3 is a partial enlarged view near end portions of a first power supply line and a second power supply line of an array substrate of a display panel according to the present disclosure.

FIG. 1 to FIG. 3 only partially show a display area, and in order to show the structure, the illustration is schematic, but not drawn according to the actual scale. As shown in FIG. 1 to FIG. 3, a display panel according to the present disclosure includes an array substrate 100 and an encapsulation cover plate 200, wherein a first power supply line 120 and a second power supply line 130 are arranged on a same layer on the array substrate 100. The second power supply line 130 is disconnected by an opening 140, a first connecting line 122 is connected with the first power supply line 120 through the opening 140, and a second connecting line 132 is connected with the second power supply line 130. The second power supply lines 130 on both sides of the opening 140 are electrically connected by a jumper 210 arranged on the encapsulation cover plate 200.

With this technical solution, the first connecting line 122 connected with the first power supply line 120 passes through the opening 140 of the second power supply line 130, and the second power supply lines at both ends of the opening 140 are connected by arranging a jumper on the encapsulation cover plate 200, thus a good heat dissipation effect is achieved and a problem that the Planarization layer is easy to carbonize due to the heat caused by arranging the jumper under the second power supply line is avoided.

The array substrate 100 further includes a first test electrode 121 and a second test electrode 131, wherein the first test electrode 121 is connected with the first power supply line 120 by the first connecting line 122 passing through the opening 140, and the second test electrode 131 is connected with the second power supply line 130 by the second connecting line 132.

In an exemplary embodiment, the jumper 210 is made of a same material as that of the first power supply line 120.

In an exemplary embodiment, the first power supply line 120 and the second power supply line 130 are made of the same material as that of source-drain electrode lines (not shown in the figure) of the array substrate 100. In an exemplary embodiment, the first power supply line 120 and the second power supply line 130 are manufactured in a same process as the source-drain electrode lines of the array substrate 100.

In an exemplary embodiment, the material of the jumper 210 is a material with low resistivity, for example, lower than that of the material of a gate layer (not shown in the figure). In an exemplary embodiment, the material of the jumper 210 is titanium/aluminum/titanium composite material. By adopting such a solution, sputtering processing of the jumper 210 is more convenient, and heating output of the jumper 210 is lower, thus effectively avoiding the problem of carbonization of the Planarization layer.

As shown in FIG. 2 and FIG. 3, in an exemplary embodiment, the second power supply line 130 is split into two portions by the opening, which are respectively a main body portion 133 and a first end portion 134, and the jumper 210 is electrically connected with adjacent ends of the main body portion 133 and the first end portion 134. In an exemplary embodiment, the first power supply line 120 includes a second end portion 123. The first connecting line 122 is connected with the second end portion 123, and the second connecting line 132 is connected with the first end portion 134. The first end portion 134 and the second end portion 123 are located near an edge of the array substrate 100.

Parts of the first end portion 134 and the second end portion 123 which are not shielded by the encapsulation cover plate 200 are also configured to be connected with electrodes of an FPC (Flexible Printed Circuit Board) 400.

In an exemplary embodiment, the first power supply line 120 is a VDD line and the second power supply line 130 is a VSS line. In an exemplary embodiment, the VSS line 130 is arranged on one side of the VDD line 120 near a peripheral area of the display panel.

In an exemplary embodiment, two groups of the first power supply lines 120 and the second power supply lines 130 are arranged on the array substrate, and in an exemplary embodiment, the two groups of the first power supply lines 120 and the second power supply lines 130 are symmetrically arranged at one end of the array substrate.

In an exemplary embodiment, the jumper include a jumper main body 211 and jumper contacts (such as 212 and 213 in FIG. 5 to FIG. 7) electrically connected with the jumper main body 211. In an exemplary embodiment, the jumper contacts include a first jumper contact 212 and a second jumper contact 213. The first jumper contact 212 is connected with one end of the jumper main body 211, and the second jumper contact 213 is connected with the other end of the jumper main body 211.

In an exemplary embodiment, the array substrate 100 includes a glass substrate 110, and a gate insulating layer, a gate layer, an interlayer insulating layer, a source-drain layer and a Planarization layer which are sequentially stacked on the glass substrate.

In an exemplary embodiment, the gate insulating layer includes two layers.

In an exemplary embodiment, the interlayer insulating layer includes two layers.

Figure 4:
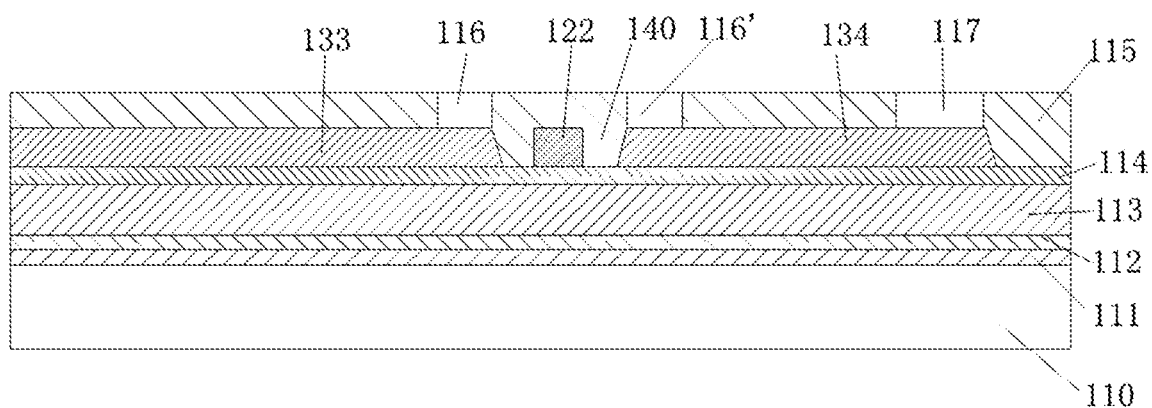
FIG. 4 is a partial cross-sectional view of an array substrate of a display panel according to the present disclosure.

As shown in FIG. 4, in an exemplary embodiment, the array substrate 100 includes:

a glass substrate 110;

a first insulating layer 111 and a second insulating layer 112 (not shown) stacked on the glass substrate 110;

a gate layer (not shown in the sectional view) arranged on the second insulating layer 112;

a third insulating layer 113 covering the gate layer;

a fourth insulating layer 114 arranged on the third insulating layer 113;

a source-drain layer (including the first power supply line 120, the second power supply line 130, the connecting lines 122/132, etc.) arranged on the fourth insulating layer 114; and a Planarization layer 115 arranged on the source-drain layer.

The Planarization layer 115 is provided with a first sub-opening 116 and a second sub-opening 116', wherein the second power supply line 130 is exposed by the first sub-opening 116 and the second sub-opening 116'. The first sub-opening 116 and the second sub-opening 116' are configured as access points for connecting the first jumper contact and the second jumper contact with the second power supply line 130.

The Planarization layer 115 is further provided with a third opening 117, wherein the third opening 117 exposes surfaces of the first power supply line 120 and the second power supply line 130 and is configured to connect the FPC 400 with the first end portion 134 of the second power supply line 130 and connect the FPC 400 with a portion of the second end portion 123 of the first power supply line 120 which is not covered by the encapsulation cover plate 200.

In an exemplary embodiment, material of the first insulating layer 111 and the second insulating layer 112 is silicon nitride (SiN) or silicon oxynitride (SiON).

In an exemplary embodiment, material of the third insulating layer 113 and the first insulating layer 114 is silicon nitride (SiN) or silicon oxynitride (SiON).

In an exemplary embodiment, there is an insulating layer between the glass substrate 110 and the gate layer, there are two insulating layers between the gate layer and the source-drain layer, or there are two insulating layers between the glass substrate 110 and the gate layer and one insulating layer between the gate layer and the source-drain layer.

In an exemplary embodiment, material of the gate layer is molybdenum, aluminum or copper, which is not limited thereto, and may also be chromium, tungsten, titanium, tantalum and alloy materials containing these materials.

In an exemplary embodiment, the encapsulation cover plate 200 includes:

a second glass substrate 201, and a fifth insulating layer 202, the jumper main body 211, a sixth insulating layer 204 and the jumper contacts 212/213 which are sequentially arranged on the second glass substrate 201.

Figure 5:
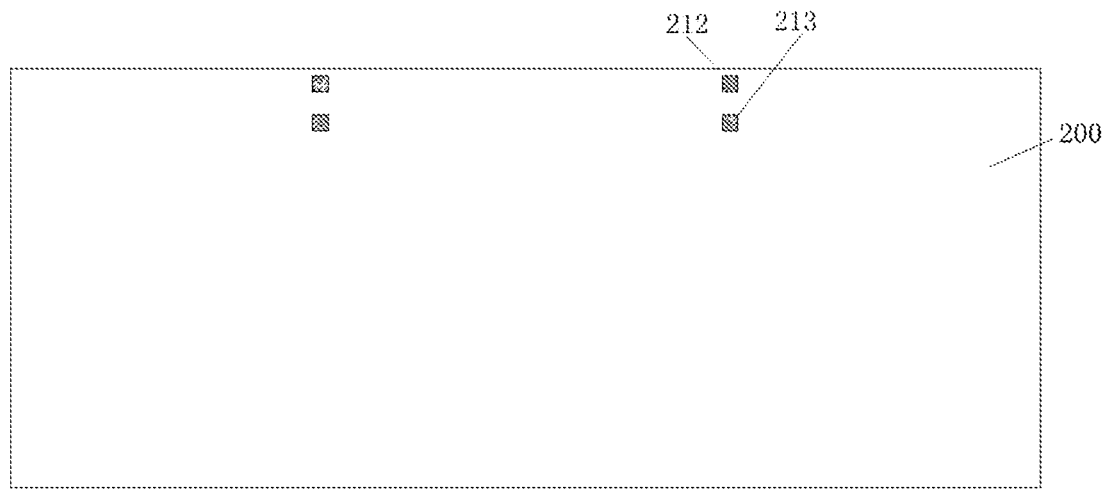
FIG. 5 is a front view of an encapsulation cover plate of a display panel according to the present disclosure.
Figure 6:
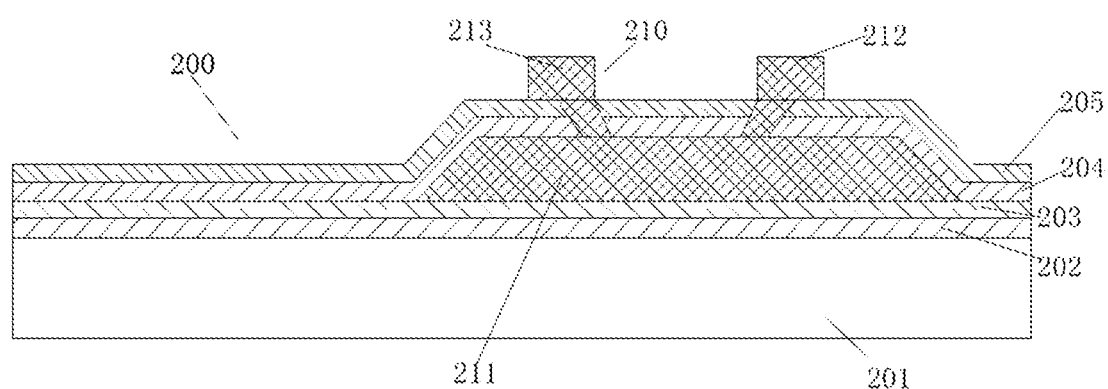
FIG. 6 is a partial cross-sectional view of an encapsulation cover plate of a display panel according to the present disclosure.

As shown in FIG. 5 and FIG. 6, in an exemplary embodiment, a seventh insulating layer 203 is arranged between the fifth insulating layer 202 and the jumper main body 211. An eighth insulating layer 205 is further arranged between the sixth insulating layer and the jumper contacts 212/213.

Material of the fifth insulating layer 202, the sixth insulating layer 204, the seventh insulating layer 203 and the eighth insulating layer 205 may be silicon nitride (SiN) or silicon oxynitride (SiON).

In an exemplary embodiment, the jumper contacts 212/213 are in contact with the jumper main body 211 through conductive paths provided in the seventh insulating layer 203 and the eighth insulating layer 205.

Figure 7:
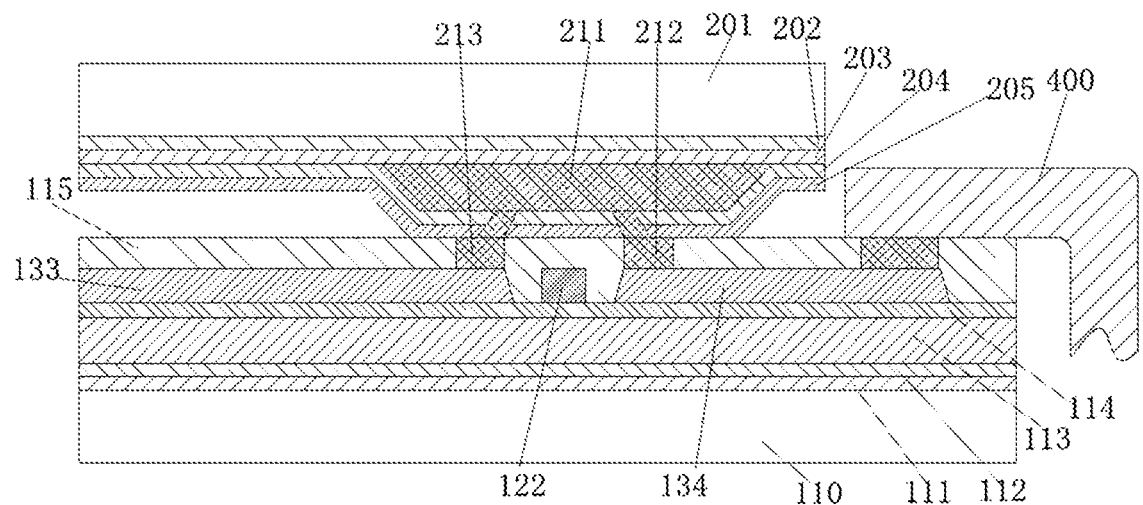
FIG. 7 is a schematic diagram showing assembly of an array substrate and an encapsulation cover plate of a display panel according to the present disclosure.

As shown in FIG. 7, when the encapsulation cover plate 200 is connected with the array substrate 100, the first jumper contact 212 and the second jumper contact 213 on the encapsulation cover plate enter into the first sub-opening 116 and the second sub-opening 116' on the Planarization layer 115 of the array substrate 100, respectively, and are electrically connected with the adjacent ends of the main body portion 133 and the first end portion 134 of the second power supply line 130, such that a bridging between the main body portion 133 and the first end portion 134 is realized.

The encapsulation cover plate 200 is connected with the array substrate 100 through an FRIT adhesive.

As shown in FIG. 1, the area of the encapsulation cover plate 200 is smaller than the area of the array substrate 100, so that there is a region on the array substrate 100 that is not covered by the encapsulation cover plate 200. A part of the first end portion 134 away from the main body portion 133 and the second end portion 123 of the first power supply line 120 are located in this region to facilitate the electrical connection with an electrode of the FPC 400.

In an exemplary embodiment, the electrode of the FPC 400 enters the third opening 117 of the Planarization layer 115 and is connected with the first end portion 134 and/or the second end portion 123.

The present disclosure further provides a display apparatus, which includes the display panel in any of the above embodiments or implementations.

Referring to FIG. 1 to FIG. 7, a display panel according to an embodiment of the present disclosure and its working process will be described below. The display panel includes an array substrate 100 and an encapsulation cover plate 200, wherein the array substrate 100 includes:

a glass substrate 110;

a first insulating layer 111 and a second insulating layer 112 which are made of silicon nitride (SiN) and stacked on a glass substrate 110;

a gate layer arranged on the second insulating layer 112, wherein the gate layer is made of molybdenum;

a third insulating layer 113 which is made of silicon nitride (SiN) and covers the gate layer;

a fourth insulating layer 114 which is made of silicon nitride (SiN) and is arranged on the third insulating layer 113;

a source-drain layer arranged on the fourth insulating layer 114, wherein material of the source-drain layer is a titanium/aluminum/titanium composite material; and a Planarization layer 115 which is formed by an organic resin layer (such as polyimide, PI) and arranged on the source-drain layer.

The source-drain layer includes a VDD line 120, a VSS line 130, a first test electrode 121 and a second test electrode 131, wherein the first test electrode 121 is connected with the VDD line 120 through a first connecting line 122, and the second test electrode 131 is connected with the VSS line 130 through a second connecting line 132.

In an exemplary embodiment, the VSS line 130 is arranged on one side of the VDD line 120 away from the longitudinal centerline of the array substrate.

In an exemplary embodiment, two groups of the VDD lines 120, the VSS lines 130, the first test electrodes 121, the second test electrodes 131, the first connecting lines 122 and the second connecting lines 132 are arranged symmetrically on the array substrate.

In an exemplary embodiment, the VSS line 130 is split into two portions by an opening 140, which are a main body portion 133 and a first end portion 134 respectively, wherein the first connecting line 122 is connected with the VDD line 120 through the opening 140.

In an exemplary embodiment, the Planarization layer 115 is provided with a first sub-opening 116, a second sub-opening 116' and a third opening 117, wherein the first sub-opening 116 and the second sub-opening 116' expose adjacent ends of the main body portion 133 and the first end portion 134, facilitating jumper contacts 212/213 of a jumper 210 to enter and electrically connect with the first power supply line. The third opening 117 is configured to connect a FPC 400 with the first end portion 134 of the VSS line 130 and connect the FPC 400 with the second end portion 123 of the VDD line 120.

In an exemplary embodiment, the encapsulation cover plate 200 includes:

a second glass substrate 201; and a fifth insulating layer 202, a sixth insulating layer 204, a jumper main body 211, a seventh insulating layer 203, an eighth insulating layer 205, and first and second jumper contacts 212/213 which are sequentially arranged on the second glass substrate 201.

In an exemplary embodiment, the jumper main body 211 is connected with the first jumper contact 212 and the second jumper contact 213 through conductive paths provided in through holes of the silicon nitride layer 204 and the polyimide layer 205.

The jumper main body 211, the conductive paths, the first jumper contact 212 and the second jumper contact 213 are made of a same material, such as titanium/aluminum/titanium composite material.

During installation, the encapsulation cover plate 200 is fastened to the array substrate 100 by a sealant 300, wherein the first jumper contact 212 and the second jumper contact 213 enter the first sub-opening 116 and the second sub-opening 116' respectively, and are in contact with the adjacent ends of the main body portion 133 and the first end portion 134 of the VSS line 130 respectively to achieve an electrical connection.

The size of the encapsulation cover plate 200 is smaller than that of the array substrate 100, and the array substrate 100 has a region not covered by the encapsulation cover plate 200. A part of the first end portion 134 away from the main body portion 133 and the second end portion 123 of the VDD line 120 are located in this region to facilitate the electrical connection with an electrode of the FPC 400.

In an exemplary embodiment, the electrode of the FPC 400 may enter the third opening 117 and be connected with the first end portion 134 of the VSS line 130 and the second end portion 123 of the VDD line 120, respectively.

When a test is needed, a large voltage is input between the first test electrode 121 and the second test electrode 131, and the current flows sequentially through the first connecting line 122, the VDD line 120, a pixel circuit on the array substrate (not shown in the figure), the main body portion 133 of the VSS line 130, the second jumper contact 213, the jumper main body 211, the first jumper contact 212 and the end portion 134, so that the pixels emit light for lighting up the screen to perform an aging test, etc.

Moreover, a large voltage is applied to the second end portion 123 of the VDD line 120 and the first end portion 134 of the VSS line 130 through contacts of the FPC 400. Similarly, the current flows sequentially through the VDD line 120, the pixel circuit on the array substrate (not shown in the figure), the main body portion 133 of VSS line 130, the second jumper contact 213, the jumper main body 211, the first jumper contact 212 and the first end portion 134, so that the pixels emit light to display an image for lighting up the screen to perform an aging test, etc.

In this process, the jumper main body 211 generates less heat, and the jumper main body is arranged on the encapsulation cover plate 200 for good heat dissipation, which will not cause carbonization and conduction of the Planarization layer, thus abnormal display of the display panel is avoided.

To sum up, by adopting the technical solution disclosed by the present disclosure, the second power supply lines at both ends of the opening are connected by arranging the jumper on the encapsulation cover plate, thereby the problem that the Planarization layer is easy to carbonize due to the heat caused by arranging the jumper under the second power supply lines is avoided. Especially, using the material of the jumper having a low resistivity can reduce the heat output and avoid the abnormal display problem caused by short circuit.

The above description is only an illustration of the exemplary embodiments of the present disclosure and the applied technical principles. It should be understood by those skilled in the art that the scope of disclosure involved in the present disclosure is not limited to the technical solutions formed by the specific combination of the above-mentioned technical features, but also covers other technical solutions formed by any combination of the above-mentioned technical features or their equivalent features without departing from the aforementioned disclosure concept. For example, a technical solution formed by replacing the above features with the technical features with similar functions disclosed in (but not limited to) the present disclosure.

What is claimed is:

1. A display panel, comprising:
an array substrate and an encapsulation cover plate,
wherein a first power supply line and a second power supply line are arranged on a same layer on the array substrate, the second power supply line is disconnected by an opening, a first connecting line is connected with the first power supply line through the opening, a second connecting line is connected with the second power supply line, and the second power supply lines on both sides of the opening are electrically connected by a jumper arranged on the encapsulation cover plate.

2. The display panel according to claim 1, wherein the second power supply line comprises a main body portion and a first end portion located at both sides of the opening, and the first power supply line comprises a second end portion, wherein the first connecting line is connected with the second end portion and the second connecting line is connected with the first end portion.

3. The display panel according to claim 2, wherein a part of the first end portion and a part of the second end portion which are not shielded by the encapsulation cover plate are configured to be connected with an electrode of a flexible printed circuit board (FPC).

4. The display panel according to claim 1, wherein the array substrate further comprises a first test electrode and a second test electrode, the first test electrode is connected with the first connecting line, and the second test electrode is connected with the second connecting line.

5. The display panel according to claim 1, wherein the first power supply line is a Voltage Drain (VDD) line and the second power supply line is a Voltage Source (VSS) line.

6. The display panel according to claim 5, wherein the VSS line is arranged on one side of the VDD line near a peripheral area of the display panel.

7. The display panel according to claim 1, wherein a resistivity of the jumper is lower than a resistivity of a gate layer on the array substrate.

8. The display panel according to claim 1, wherein the jumper comprises a jumper main body, and a first jumper contact and a second jumper contact which are electrically connected with both ends of the jumper main body.

9. The display panel according to claim 8, wherein the array substrate comprises a Planarization layer covering a layer where the first power supply line and the second power supply line are located, and the Planarization layer is provided with a first sub-opening and a second sub-opening, the first sub-opening and the second sub-opening expose the second power supply line and are configured as access points for electrically connecting the first jumper contact and the second jumper contact with the second power supply line.

10. The display panel according to claim 9, wherein the Planarization layer is further provided with a third opening configured to electrically connect a flexible printed circuit board (FPC) with the end portions of the first power supply line and the second power supply line.

11. The display panel according to claim 8, wherein the encapsulation cover plate comprises a second glass substrate, and a fifth insulating layer, the jumper main body, a sixth insulating layer, the first jumper contact and the second jumper contact which are sequentially arranged on the second glass substrate, wherein the first jumper contact and the second jumper contact are electrically connected with the jumper main body.

12. A display apparatus, comprising a display panel comprising an array substrate and an encapsulation cover plate,
wherein a first power supply line and a second power supply line are arranged on a same layer on the array substrate, the second power supply line is disconnected by an opening, a first connecting line is connected with the first power supply line through the opening, a second connecting line is connected with the second power supply line, and the second power supply lines on both sides of the opening are electrically connected by a jumper arranged on the encapsulation cover plate.

13. The display apparatus according to claim 12, wherein the second power supply line comprises a main body portion and a first end portion located at both sides of the opening, and the first power supply line comprises a second end portion, wherein the first connecting line is connected with the second end portion and the second connecting line is connected with the first end portion.

14. The display apparatus according to claim 13, wherein a part of the first end portion and a part of the second end portion which are not shielded by the encapsulation cover plate are configured to be connected with an electrode of a flexible printed circuit board (FPC).

15. The display apparatus according to claim 12, wherein the array substrate further comprises a first test electrode and a second test electrode, the first test electrode is connected with the first connecting line, and the second test electrode is connected with the second connecting line.

16. The display apparatus according to claim 12, wherein the first power supply line is a VDD line and the second power supply line is a VSS line.

17. The display apparatus according to claim 16, wherein the VSS line is arranged on one side of the VDD line near a peripheral area of the display panel.

18. The display apparatus according to claim 12, wherein a resistivity of the jumper is lower than a resistivity of a gate layer on the array substrate.

19. The display apparatus according to claim 12, wherein the jumper comprises a jumper main body, and a first jumper contact and a second jumper contact which are electrically connected with both ends of the jumper main body.

20. The display apparatus according to claim 19, wherein the array substrate comprises a Planarization layer covering a layer where the first power supply line and the second power supply line are located, and the Planarization layer is provided with a first sub-opening and a second sub-opening, the first sub-opening and the second sub-opening expose the second power supply line and are configured as access points for electrically connecting the first jumper contact and the second jumper contact with the second power supply line.

* * * * *